United States Patent

Okunaga

[11] Patent Number: 5,412,333
[45] Date of Patent: May 2, 1995

[54] SEMICONDUCTOR DEVICE HAVING BONDING OPTIONAL CIRCUIT

[75] Inventor: Kazuo Okunaga, Tokyo, Japan

[73] Assignee: NEC Corporation, Tokyo, Japan

[21] Appl. No.: 74,673

[22] Filed: Jun. 10, 1993

[30] Foreign Application Priority Data

Jun. 10, 1992 [JP] Japan .................. 4-150177

[51] Int. Cl.$^6$ .................................. H03K 3/01
[52] U.S. Cl. .................. 327/198; 327/391; 327/544
[58] Field of Search .......... 307/272.3, 296.1, 296.3, 307/571

[56] References Cited

U.S. PATENT DOCUMENTS 4,985,641 1/1991 Nagayama et al. ............. 307/272.3

Primary Examiner—Margaret Rose Wambach
Attorney, Agent, or Firm—Sughrue, Mion, Zinn, Macpeak & Seas

[57] ABSTRACT

The power consumption of a semiconductor device capable of performing any one of a plurality of functions selectively according to whether a predetermined bonding pad thereof is bonded to a power source line or a ground line is reduced during an idle time. The potential of the bonding pad when the latter is in a floating state is driven to a certain level by a current flowing through a P-type MOS transistor having a relatively large driving capability during a predetermined time from initial application of a power supply voltage to the semiconductor device. Thereafter, the bonding pad is biased by a P type MOS transistor having a relatively smaller driving capability.

9 Claims, 5 Drawing Sheets

SEMICONDUCTOR DEVICE HAVING BONDING OPTIONAL CIRCUIT

BACKGROUND OF THE INVENTION

The present invention relates to a semiconductor device capable of selecting one function from a plurality of functions and, more particularly, to a semiconductor device having a bonding optional circuit as a function selecting circuit.

With recent increases in the integration density of semiconductor devices, the number of manufacturing steps thereof and the facility therefor are considerably increased, making manufacturing of a variety of different semiconductor devices difficult. That is, if semiconductor devices having different functions were manufactured separately through different manufacturing processes, respectively, the manufacturing efficiency would likely be degraded and the total number of manufacturing steps would be considerably increased. In order to solve such problem, it is conventional for an integrated circuit which can perform a plurality of different functions to be preliminarily formed on a semiconductor substrate so that any one of these functions can be selected by using predetermined terminal(s) thereof. In such a case, when the semiconductor device is needed to perform some functions sequentially in accordance with demands, a control signal or signals for selecting a function to be performed are required to be supplied to the semiconductor device through a specific external lead or leads while the semiconductor device is operating.

On the other hand, when the semiconductor device need to perform only a certain function continuously, the function of the semiconductor device can be preliminarily selected by bonding the state of a certain terminal for function selection at a bonding step after formation of the integrated circuit. Particularly, there are a variety of, for example, semiconductor memory devices which have different optional functions with respect to a bit-construction, a refresh-cycle and a page-mode although their basic constructions are common. Since, typically such various functions are not required to be arbitrarily switched, it is effective to select a function of each semiconductor device at the bonding step after a number of integrated circuits are formed through a common process.

A semiconductor device whose function is selected at a bonding step of its manufacturing process will be described with reference to FIG. 1. A semiconductor integrated circuit device 46 shown in FIG. 1 includes, within an integrated circuit chip 45 encapsulated in a case 48, a bonding option judging circuit 40, an internal circuit 49 and a bonding pad 44 which is selected to be connected or not to an external lead pin by a bonding wire. In this drawing, the pad 44 is connected or bonded to an external grounding lead or pin GNDPIN by a wire 47. The bonding option judging circuit 40 includes a level detection circuit 42 composed of an inverter IV1 and connected to the bonding option pad 44, an output waveform shaping circuit portion 43 having series-connected inverters IV2 and IV3 and responding to a signal from the level detection circuit 42 to output an output signal BOPT, and a bias circuit 41 supplying the logic high level to the circuit 42 when the bonding pad 44 is not connected to the pin GNDPIN. The bias circuit 41 includes a p-type MOS transistor Q5 connected between the bonding pad 44 and a power voltage source $V_{DD}$ and having a gate grounded. This MOS transistor Q5 thus serves as a resistor.

An operation of the semiconductor device 46 will be described. When the bonding option pad 44 is connected to the external grounding lead GNDPIN by the wire 47 as shown in FIG. 1, since the current drive capability of the MOS transistor Q5 is set to a sufficiently small value, the potential of the bonding option pad 44 is substantially equal to the ground potential and therefore an input signal BOIN to the bonding judging circuit 42 is the low level. Thus, the level detection circuit 42 outputs the high level output which causes the output waveform shaping circuit portion 43 to the high level signal BOPT. On the other hand, when the bonding option pad 44 is not connected to the pin GNDPIN, the potential of the bonding option pad 44 is increased up to the potential of the power source $V_{DD}$ by the MOS transistor Q5 of the bias circuit 41. Thus, the high level input signal BOIN is supplied to the circuit 42, resulting in generation of the low level output signal BOPT from the output waveform shaping circuit 43. The output signal BOPT is supplied to the internal circuit 49. Thus, the internal circuit 49 selects and performs a certain function corresponding to the level of the output signal BOPT.

In the bonding option judging circuit 40 thus constructed, the MOS transistor Q5 of the floating measure circuit portion 41 is always in a conductive state. For this reason, when the bonding option pad 44 is connected to the external grounding lead GNDPIN, it continuously consumes power. In order to suppress the power consumption, therefore, it is preferable that the current drive capability of the P-type MOS transistor Q5, i.e. the impedance thereof, is made very small. In this case, however, it takes for a long time for the transistor Q5 to raise the potential of the bonding option pad 44 in response to the power voltage switch-on when the bonding pad 44 is not connected to the pin GNDPIN. This means that the transistor Q5 hardly increases the signal BOIN above the threshold level of the inverter IV1 within a predetermined time, so that the circuit 40 may hold its output BOTP at the low level when the internal circuit 49 fetches the signal BOTP in spite of the pad 44 being not connected to the pin GNDPIN. The function of the internal circuit 49 may be thus selected erroneously.

SUMMARY OF THE INVENTION

It is therefore an object of the present invention to provide a semiconductor device having an improved bonding optional circuit.

It is another object of the present invention to provide a semiconductor device having a bonding optional circuit which produces an output signal representative of a state of a bonding pad in a short time without consuming a large amount of power.

A semiconductor device according to the present invention comprises a bonding pad optionally connected to a first power voltage terminal and a judging circuit coupled to the bonding pad and detecting a potential of the bonding pad to output a detection signal indicative of the level of the pad, the judging circuit including a first circuit coupled between the bonding pad and a second power voltage terminal to drive the bonding pad to a potential at the second power voltage terminal and a second circuit coupled between the ponding pad and the second power voltage terminal and activated only during a predetermined period of time from an application of a power voltage between the first and second power voltage terminals to drive the bonding pad to the potential at the second power voltage terminal.

It is convenient that the first circuit includes a first transistor connected between the second power voltage terminal and the bonding pad and having a gate connected to the first power voltage terminal and the second circuit includes a second transistor connected between the second power voltage terminal and the bonding pad and having a gate supplied with such a control signal that turns the second transistor ON only during the predetermined period of time from the application of the power supply voltage.

The control signal is preferably generated by a power-on-reset signal generator which includes a load resistance element and a capacitance element connected in series between the first and second power voltage terminal and an output portion composed of a series connection of a plurality CMOS inverters. It is further preferable that the second transistor has a channel width larger than that of the first transistor and a channel length shorter than that of the first transistor. The threshold voltage of the second transistor is set to be a value lower than that of the first transistor.

According to another aspect of the present invention, there is provided a semiconductor device comprising a first impedance element connected between a bonding pad and a first voltage terminal, a detection circuit for detecting the potential of the bonding pad to produce an internal signal whose potential is dependent on whether or not the bonding pad is connected to a second voltage terminal, a second impedance element connected in parallel to the first impedance element between the bonding pad and the first voltage terminal, and a control circuit controlling the second impedance element such that the second impedance element provides a low impedance for a predetermined period of time from an application of a power source to the semiconductor device and provides thereafter a high impedance.

BRIEF DESCRIPTION OF THE DRAWINGS

The above and other objects, features and advantages of the present invention will be more apparent from the following description taken in conjunction with the accompanying drawings, in which

FIG. 5 (B) is a timing chart showing an operation of the power-on circuit in FIG. 5 (A).

DETAILED DESCRIPTION OF THE PREFERRED EMBODIMENTS

Figure 1:
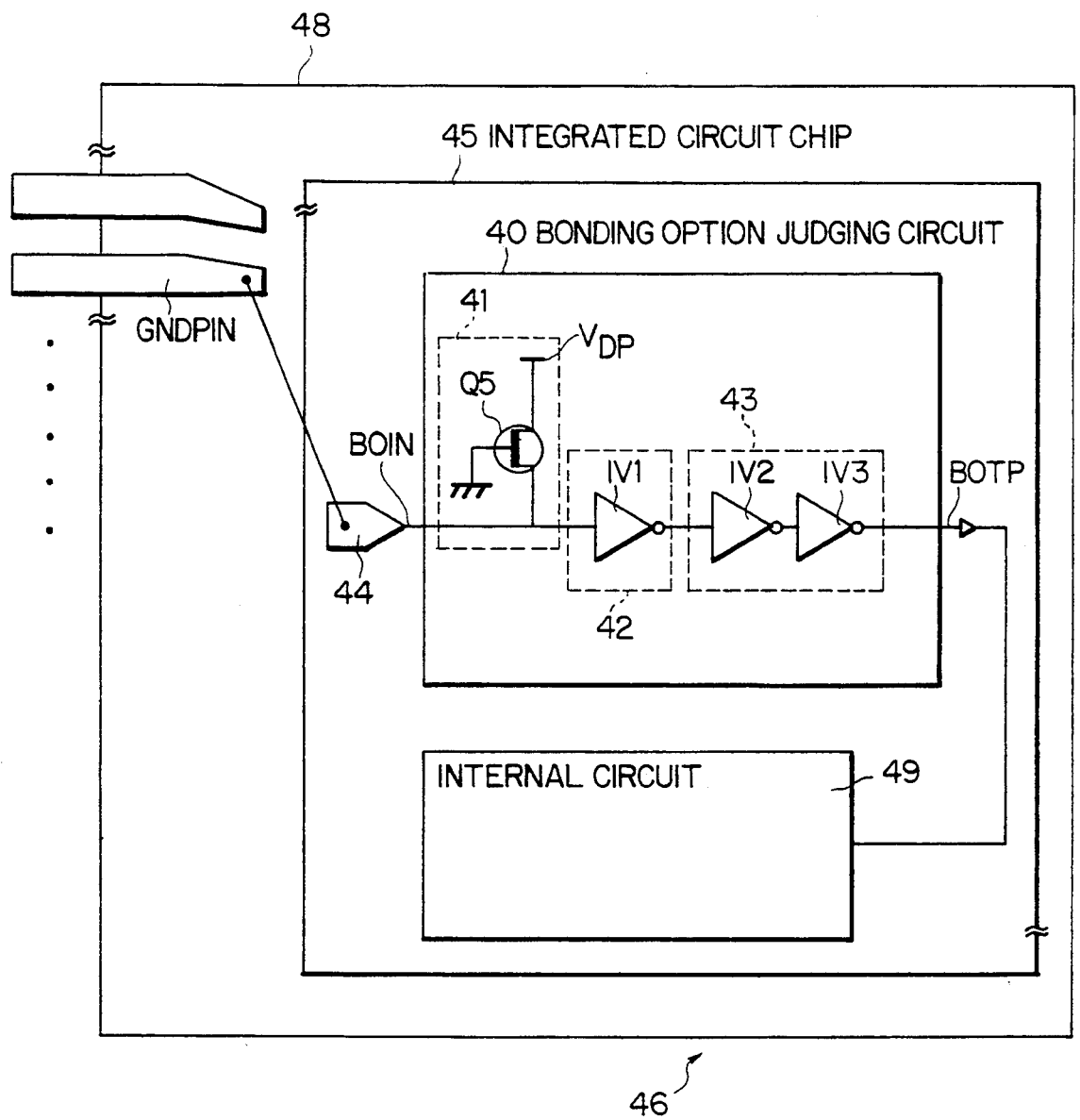
FIG. 1 is a plan view of a semiconductor device having a conventional bonding option judging circuit.
Figure 2:
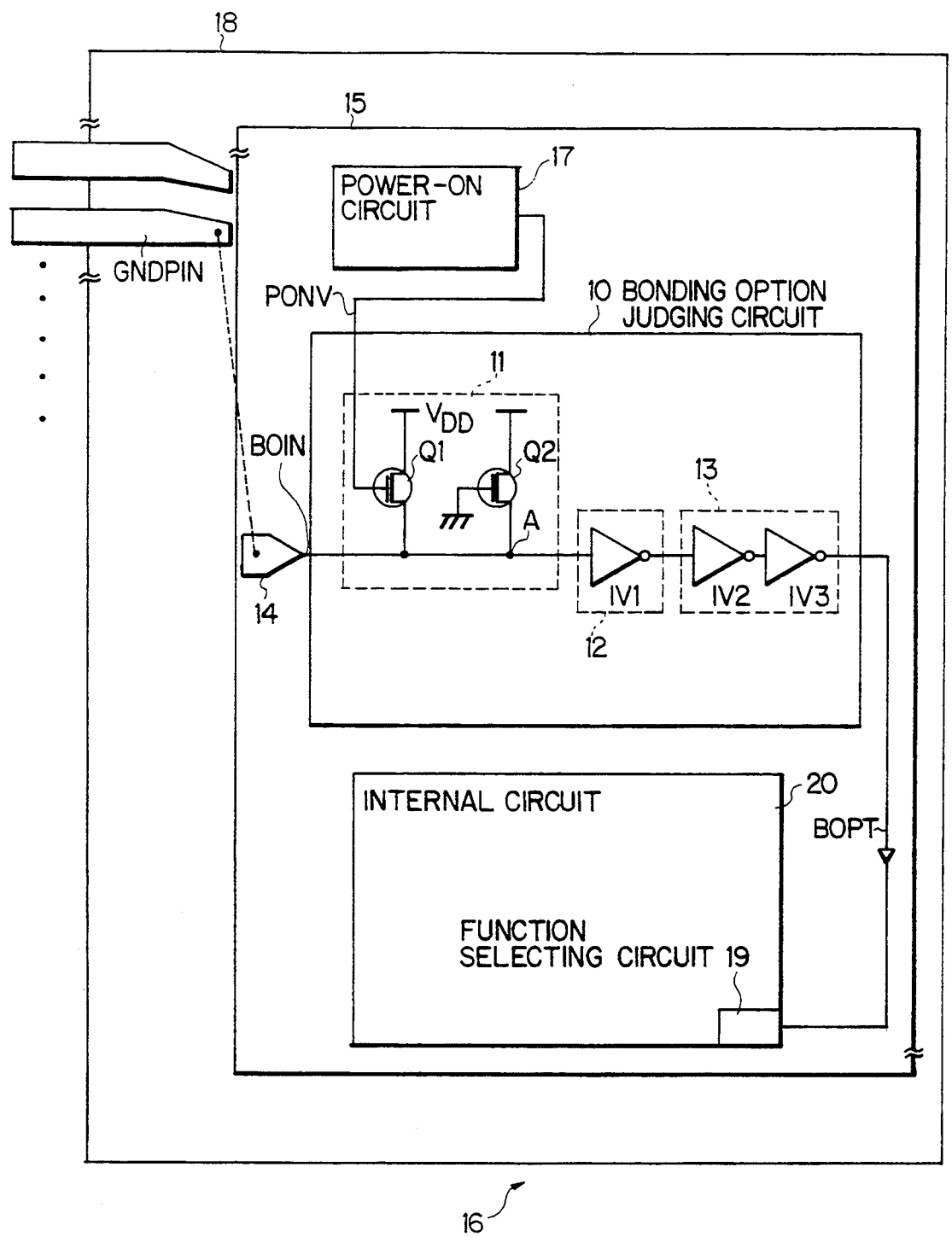
FIG. 2 is a plan view of a semiconductor device with a circuit portion thereof according to a first embodiment of the present invention.

Referring to FIG. 2, a semiconductor device 16 according to a first embodiment of the present invention includes an integrated circuit chip 15 encapsulated in a package 18. The chip 15 includes the bonding option judging circuit 10 and a bonding option pad 14. Optionally, the bonding option pad 14 may be connected to an external grounding lead or pin GNDPIN by a wire as shown by a dotted line. The bonding option judging circuit 10 includes a level detection circuit 12 composed of an inverter IV1 and connected to the bonding option pad 14, an output waveform shaping circuit 13 including a series connection of inverters IV2 and IV3 and responding to an output of the circuit 12 to output an output signal BOPT, and a bias circuit 11. This circuit 11 includes a P-type MOS transistor Q2 connected between the bonding option pad 14 and a power source $V_{DD}$ and having a gate grounded and a P-type MOS transistor Q1 connected between the bonding option pad 14 and the power source $V_{DD}$ and having a gate supplied with an output signal PONV of the power-on circuit 17, in accordance with the present invention. The drive capability of the P-type MOS transistor Q2 is designed to be smaller than that of the transistor Q5 (see FIG. 1). The drive capability of the P-type MOS transistor Q1 is designed to be larger than that of the MOS transistor Q2. That is, the transistor Q1 has a shorter channel length and/or wider channel width compared with those of the P-type MOS transistor Q2. This situation can be realized by providing the P-type MOS transistor Q2 with a plurality of series connected P type MOS transistors and the P type MOS transistor Q1 with a plurality of parallel connected P type MOS transistors. Alternatively, a similar situation can be realized by making a threshold voltage value of the P type MOS transistor Q1 relatively smaller. If desired, the transistor Q1 may be replaced with a resistor having a high resistance. The transistor Q2 is supplied at the gate thereof with a control signal PONV from a power-on circuit 17.

Figure 3A:
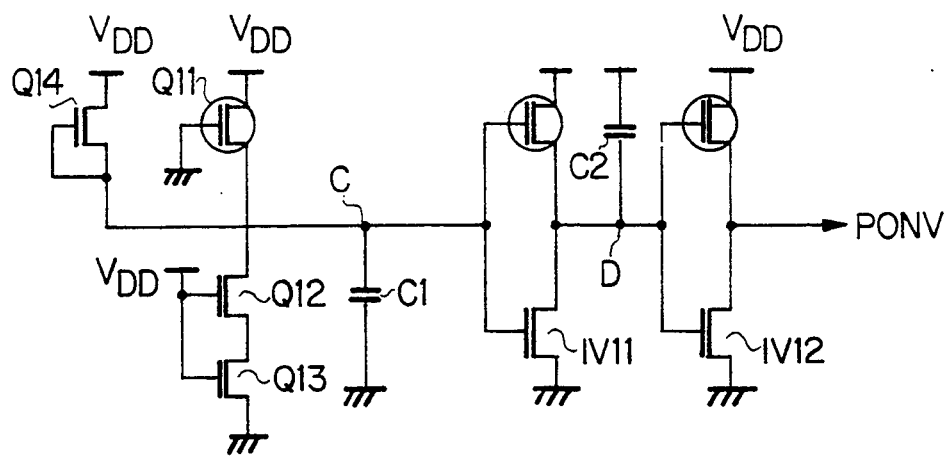
FIG. 3(A) is a circuit diagram of a power-on circuit in FIG. 2.

Turning to FIG. 3, the power-on circuit 17 includes a series connection of a P-type MOS transistor Q11 as a load resistance element and a capacitance element C1 connected between the power source $V_{DD}$ and the ground line GND. The potential at a node C between the P type MOS transistor Q11 and the capacitance element C1 is output as the output signal PONV through CMOS inverters IV11 and IV12. The gate of the P type MOS transistor Q11 is connected to the ground line GND. A series connection of N-type MOS transistors Q12 and Q13 which have gates connected commonly to the power source $V_{DD}$ is connected between the node C and the ground line GND, by which charging rate of the capacitance element C1 through the P-type MOS transistor Q11 and the potential of the common junction C after charged are regulated. A capacitance element C2 is further provided between the power source $V_{DD}$ and a node D between the output of the inverter IV11 and the input of the inverter IV12.

Figure 3B:
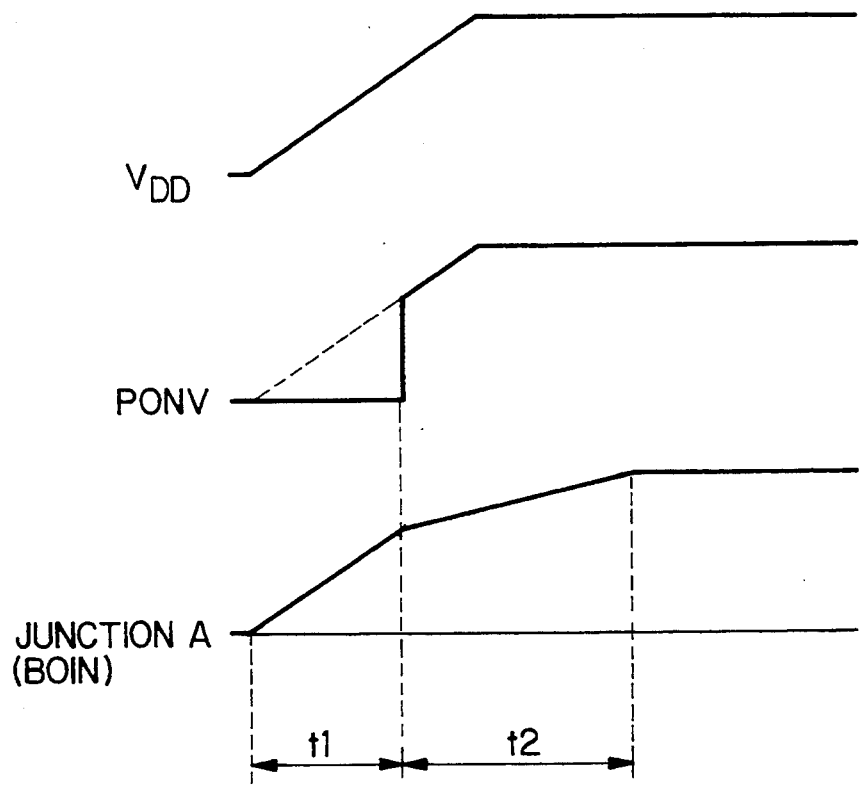
FIG. 3(B) is a timing chart showing an operation of the power-on circuit of FIG. 3 (A)

FIG. 3(B) is a timing chart showing an operation of the power-on circuit 17. In FIG. 3(B), when there is no power source voltage applied to the semiconductor device 16, potentials at the junctions C and D and potential of the output signal PONV are substantially equal to the ground potential. When the power source is connected to the semiconductor device 16 and the potential of the power source $V_{DD}$ starts to increase, potential at the junction D is risen first through the capacitance element C2 and the N type MOS transistor of the inverter IV12 is turned on. Thus, the output signal PONV becomes low level, that is, ground potential.

Thus, the output signal PONV is fixed at the low level immediately after the application of the power source voltage. When the power source voltage increases to turn the transistor Q11 ON, the capacitance element C1 starts being charged to increase the potential at the junction C. Further, the N-type MOS transistors Q12 and Q13 are also turned ON to regulate the charging current to the capacitance element C1. Consequently, as shown in FIG. 3(B), when a time t1 lapses after the application of the power source potential, the potential of the junction C exceeds the threshold voltage of the CMOS inverter IV11 so that the output voltage of the CMOS inverter IV11 is inverted to the ground potential. The potential of the output signal PONV thereby becomes the high level corresponding to the potential of the power source $V_{DD}$. Thus, during the period of time t1 from the application of the power source voltage, the power-on circuit 17 produces the low level signal PONV which is in turn supplied to the gate of the P-type MOS transistor Q1. The gate of the P type MOS transistor Q2 is grounded. Therefore, when the potential of the power source $V_{DD}$ becomes larger than an absolute value of the threshold voltage of each of the MOS transistors Q1 and Q2, these MOS transistors are turned on to supply a current to a junction A therethrough. Since both of the transistors Q1 and Q2 are turned ON, the current flowing from the power source $V_{DD}$ to the junction A is relatively large. At this time, assuming that the bonding option pad 14 (FIG. 2) is connected to the ground pin GNDPIN by a wire as shown by a dotted line, the currents supplied from the power source $V_{DD}$ through the P type MOS transistors Q1 and Q2 flow into the external lead GNDPIN, so that the potential at the junction A, i.e. the signal BOIN, is maintained at substantially ground potential. Therefore, the bonding judging circuit portion 12 produces the high level signal BOPT. A function selecting circuit 19 provided in an internal circuit 20 fetches the high level signal BOPT to select a function corresponding thereto.

After the period of time t1, the signal PONV of the power-on circuit 17 is changed to the high level as shown in FIG. 3(B) correspondingly to the potential of the power source $V_{DD}$. Therefore, the MOS transistor Q1 is turned OFF. The MOS transistor Q2 is maintained in the conductive state. A D.C. current thus continues to flow between the power source terminals $V_{DD}$ and GND. However, the drive capability of the transistor Q2 is designed to be very small (i.e., the impedance of the transistor Q2 being very high), only a very small amount of power is consumed.

As described above, when the bonding option pad 14 is grounded by bonding, the current flows from the power source $V_{DD}$ through the P-type MOS transistors Q1 and Q2 in the bonding option judging circuit portion 10 to ground only during the time period t1 from the application of the potential of the power source $V_{DD}$ to the semiconductor device 16 and thus power consumption is relatively large. The time period t1 is, however, very short, for example several hundred microseconds or less. The power consumption during this period is thus substantially negligible. Moreover, during a normal operation period after the time period t1, the current flows only through the transistor Q2 having very small drive capability. Thus the power consumption of the semiconductor device 16 becomes very small. The output signal BOPT of the bonding option judging circuit 10 is fixed to a high level during the delay time period t1 as well as the subsequent normal operation period.

The output signal BOPT is supplied to a function selecting circuit 19 of the internal circuit 20, so that the circuit 19 commands the internal circuit 20 to perform a predetermined one of functions corresponding to the low level signal BOPT. The function of the semiconductor device 16 in normal operation is thus specified. For example, in a memory device, a bit construction thereof is set to 16 bits, or it becomes possible to use the page mode.

Next, a case where the bonding option pad 14 is not connected to the pin GNDPIN will be described.

The output signal PONV of the power-on circuit 17 is at the low level during the time period t1 from the application of the power source voltage as mentioned above. Therefore, the junction A is supplied and charged with the currents flowing through the transistors Q1 and Q2 from the power source $V_{DD}$. This current is relatively large. Therefore, the potential at the junction A, i.e. the signal BOIN, is increased rapidly during the period t1 as shown in FIG. 3(B). After the time period t1 is lapsed, the output signal PONV becomes the high level to turn the transistor Q1 OFF. The junction point A is thereafter driven only by the transistor Q2. Since the current drive capability of the transistor Q2 is very small as mentioned hereinbefore, the rising rate of the potential at the junction point A becomes gentle and finally reaches the power voltage $V_{DD}$ after a relatively long time period t2 as shown in FIG. 3(B). However, the potential raising rate of the junction point A by the transistors Q1 and Q2 is designed to reach and exceed the threshold voltage of the inverter IV1 of the circuit 12 within the time period t1 or as soon as this period time lapses. Therefore, the level detection circuit 12 produces the low level to cause the output waveform shaping circuit 13 to output the low level signal BOPT in a short time period after the application of the power source voltage.

The selecting circuit 19 receives the low level signal BOPT and thus commands the internal circuit 20 to perform a certain predetermined function corresponding thereto. For example, a memory device is selected to have the bit construction of 8 bits, or is brought into non-use of page mode.

Thus, in the semiconductor device 16 including the bonding option judging circuit 10 according to the first embodiment of the present invention described hereinbefore, the P type MOS transistors Q1 and Q2 having different drive capabilities for driving the bonding option pad 14 are used and the bonding option pad 14 is driven by the P type MOS transistor Q1 having the larger drive capability during the delay time period t1 from the initial application of the power source. Therefore, when the bonding option pad 14 is grounded, a large current flows during only the short time after the power source is turned on and thus it is possible to reduce power consumption. When the bonding option pad 14 is not grounded, the bonding option pad 14 is rapidly driven to the $V_{DD}$ level in a short time after the power source is connected. Therefore, there is no erroneous operation occurs even when the driving capability of the transistor Q2 is reduced.

Figure 4:
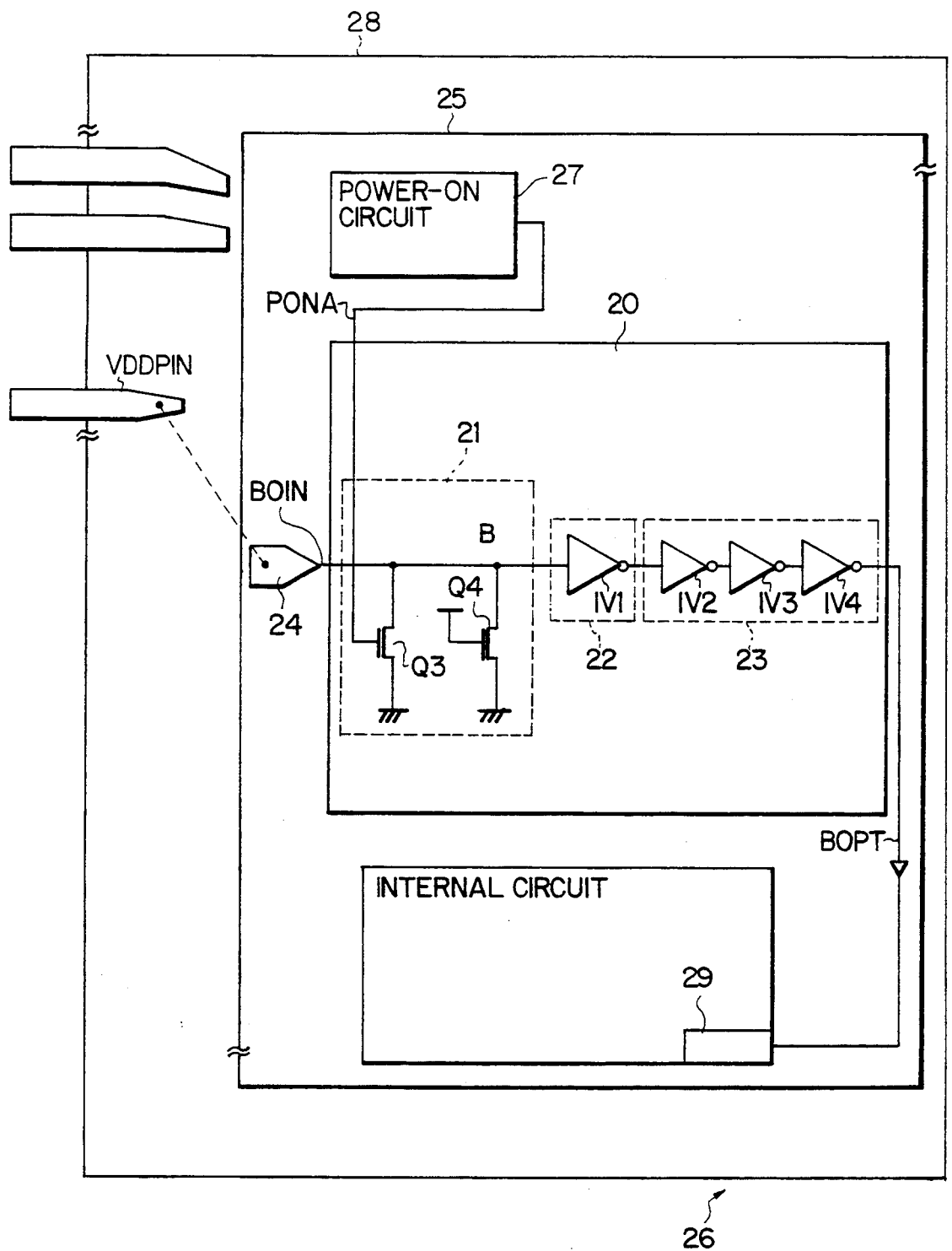
FIG. 4 is a plan view of a semiconductor memory device with a circuit portion thereof according to a second embodiment of the present invention.
Figure 5A:
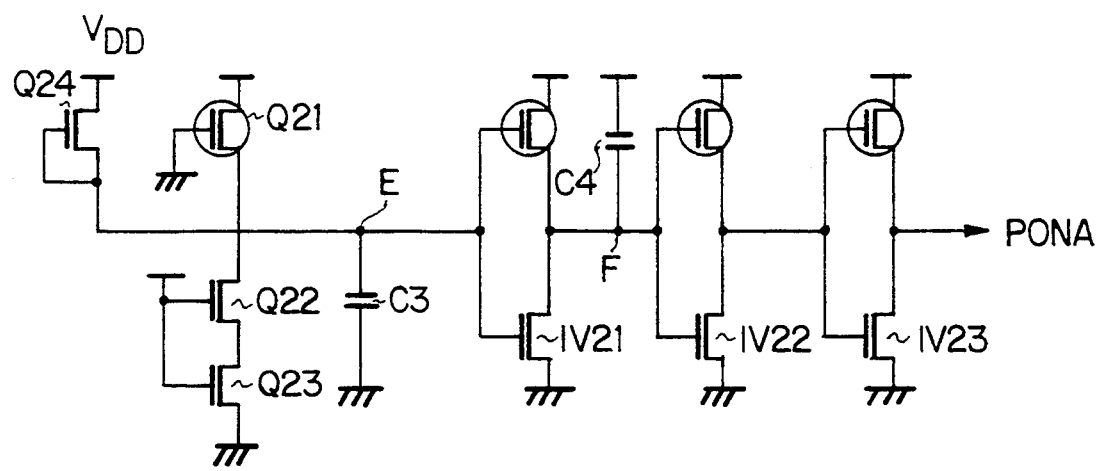
FIG. 5 (A) is a circuit diagram of a power-on circuit in FIG. 4.
Figure 5B:
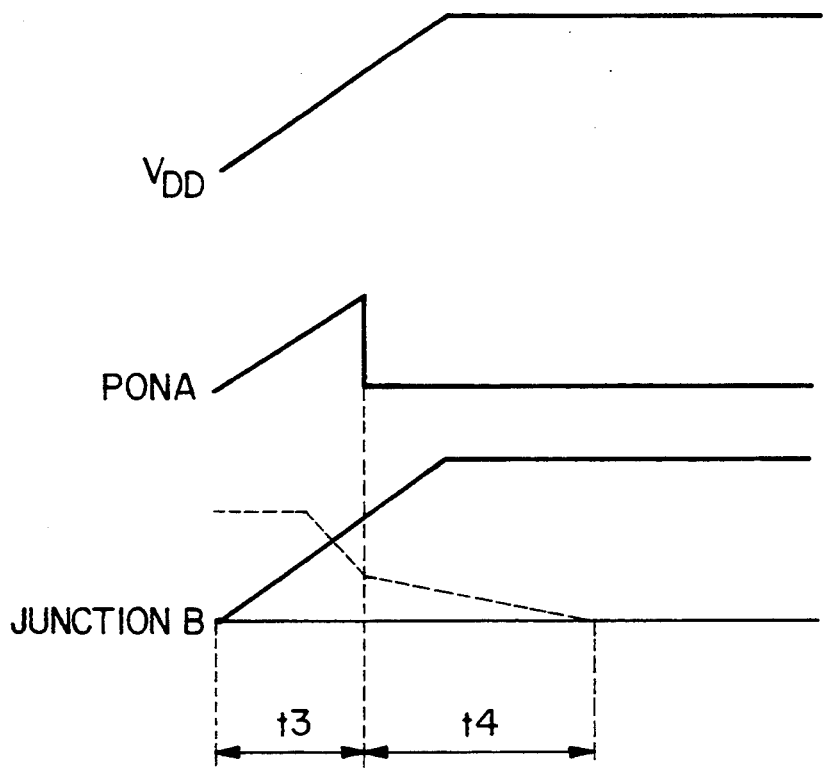

FIG. 4 is a plan view of a semiconductor memory device with a circuit portion thereof according to a second embodiment of the present invention, FIG. 5(A) is a circuit diagram of a power-on circuit 27 in FIG. 4 and FIG. 5(B) is a timing chart showing operating waveforms of the power-on circuit 27 and a bonding option judging circuit 20 when a power source is connected to this semiconductor device.

As shown in FIG. 4, the semiconductor device 26 has a similar construction to that of the first embodiment except the following points. In a floating measure circuit portion 21, N type MOS transistors Q3 and Q4 are connected between a grounding point and a signal line from a bonding option pad 24 and gates of the N type MOS transistors Q3 and Q4 are connected to an output of the power-on circuit 27 and to a power source $V_{DD}$, respectively. An output waveform shaping circuit portion 23 includes inverters IV2, IV3 and IV4 and the bonding option pad 24 is bonded to an external power source lead VDDPIN as shown by a dotted line in FIG. 4 or is made floating.

The power-on circuit 27 is shown in FIG. 5(A). The power-on circuit 27 differs from the power-on circuit 17 of the first embodiment in that three CMOS inverters IV21, IV22 and IV23 are included as an output stage portion thereof.

An operation of the power-on circuit 27 will be described. When there is no power source voltage applied to the semiconductor device 26, potentials at the junctions E and F and potential of the output signal PONA are substantially equal to the ground potential, respectively. When the power source is connected to the semiconductor 26 and potential of the power source $V_{DD}$ starts to increase, potential at the junction F is risen first through a capacitance element C4 and the N type MOS transistor of the inverter IV22 is turned on. Thus, the gate of a P type MOS transistor of the inverter IV23 becomes ground potential. When the potential of the power source $V_{DD}$ becomes higher than an absolute value of the threshold voltage of the P type MOS transistor, the output signal PONA becomes high level and equal to the potential of the power source $V_{DD}$. That is, the potential of the output signal PONV is risen to the potential of the power source $V_{DD}$ rapidly by switching the power source on if the output signal PONA is floating at a potential not lower than the ground potential before the power source is connected. When the P type MOS transistor Q21 is turned on, a capacitance element C3 is charged to increase the potential at the junction E. At this time, by current drive capability of the series connection of the N type MOS transistors Q22 and Q23, the charging rate of the capacitance element C3 and the potential at the junction point E after charged are regulated. Further, as shown in FIG. 5(B), when a time t3 lapses after the initial application of the power source potential, the potential of the junction E rises up to the threshold voltage of the CMOS inverter IV21 and an output potential of the CMOS inverter IV21 becomes ground potential. Therefore, the potential of the output signal PONA becomes low level corresponding to the ground potential.

Now, an operation of the semiconductor device 26 which is the second embodiment of the present invention will be described.

The case where the bonding option pad 24 is bonded to the external power source lead VDDPIN as shown by the dotted line in FIG. 4 will be described first.

For the delay time t3 from the initial application of the power source voltage to the semiconductor device 26, the output signal PONA of the power-on circuit 27 is at a high level as shown in FIG. 5(B) and rises along the potential of the power source $V_{DD}$. This high level output signal PONA is supplied to the gate of the N type MOS transistor Q3 in the bonding option judging circuit 20 and the gate of the P type MOS transistor Q4 is connected to the power source $V_{DD}$. Therefore, the P type MOS transistors Q3 and Q4 are turned on when the potential of the power source $V_{DD}$ becomes higher than the threshold voltage of each N type MOS transistor, allowing current to flow from the junction B to the ground point. In this case, the current flowing to the ground point is relatively large before the time period t3 lapses, during the transistors Q3 and Q4 are on. But current flowing from the power source $V_{DD}$ through the N type MOS transistors Q3 and Q4 to the ground point is sufficiently small compared with current from the external lead VDDPIN to the junction point B by bonding. Then the potential at the junction point B is maintained at substantially the potential of the power source $V_{DD}$. Therefore, the output of the floating measure circuit portion 21 and the output of the bonding judging circuit portion 22 become high level correspondingly to the signal BOIN from the bonding option pad 24 and low level, respectively, and the output signal BOPT of the output waveform shaping circuit portion 23 becomes high level. On the other hand, after the delay time t3 lapses, the output signal PONA of the power-on circuit 27 becomes low level as shown in FIG. 5(B). Therefore, in the bonding option judging circuit 20, gate potential and source potential of the N type MOS transistor Q3 become the ground potential and the N type MOS transistor Q3 is turned off. Therefore, in the floating measure circuit portion 21, the junction B is driven by only the P type MOS transistor Q4 having very small driving capability. Consequently, current floating from the power source $V_{DD}$ to the ground point becomes much smaller than that in the delay time period t3 when the transistors Q3 and Q4 are on. In this case, since the potential at the junction point B is risen to the power source potential which is the potential of the signal BOIN from the bonding option pad 24, the output signal BOPT from the output waveform shaping circuit portion 23 is maintained at high level.

As described, when the bonding option pad 24 is connected to the power source $V_{DD}$ by bonding, current flows from the power source $V_{DD}$ through the N type MOS transistors Q3 and Q4 in the bonding option judging circuit portion 20 to the ground only during the delay time period t3 and when both of the transistors Q3 and Q4 are on, and thus power consumption is relatively large. The period of on-state of the transistors Q3 and Q4 is, however, very short, for example some hundred microseconds or less. And moreover, during a normal operation after the delay time t3 has lapsed, current flows through only the transistor Q4 having very small drive capability. Thus power consumption is very small. The output signal BOPT of the bonding option judging circuit 20 becomes high level.

As in the case of the first embodiment, the output signal BOPT is supplied to a function selecting circuit portion 29 to make a predetermined one of functions of the semiconductor device 26 operable selectively. That is, by this selection of function, the function of the semiconductor device 26 in normal operation is specified. Otherwise, the semiconductor device 26 is put in an operable state with any specific function during the normal operation thereof according to demand. For example, when the semiconductor memory device 26 is a random access memory, by bonding the bonding option pad 24 to the external power source lead VDDPIN, a self refresh cycle is set to 3 ms or, during normal operation thereof, it becomes possible to perform a serial operation.

Next, a case where the bonding option pad 24 is not bonded and floating will be described.

The output signal PONA of the power-on circuit 27 during the delay time period t3 from the initial application of the power source voltage to the semiconductor memory device 26 follows the potential of the power source $V_{DD}$ and a high level is applied to the gate of the N type MOS transistor Q3 of the bonding option judging circuit portion 20. Further, since the gate of the N type MOS transistor Q4 is also connected to the power source $V_{DD}$, the N type MOS transistors Q3 and Q4 are turned on when the potential of the power source $V_{DD}$ reaches the threshold voltage to form a current path having a large drive capability from the junction point B to the ground. Therefore, and since the bonding option pad 24 is floating, the potential at the junction point B is fixed to the ground potential during this period, as shown in FIG. 5(B). If the potential at the junction point B is originally in a floating state with any potential, it is rapidly lowered as shown by a dotted line in FIG. 5(B). After the delay time t3 has lapsed, the output signal PONA becomes low level and therefore the N type MOS transistor Q3 is turned off so that the junction point B is discharged through only the N type transistor Q4. Since the current drive capability of the N type MOS transistor Q4 is very small, the lowering rate of the potential at the junction point B becomes gentle and, therefore, there is a possibility that a time period t4 for which the potential at the junction point B becomes equal to the ground potential becomes too long. However, in order to operate the bonding option circuit 20 normally, it is enough that the potential at the junction point B is lower than the threshold voltage of the inverter IV1 of the bonding option judging circuit portion 22. Therefore, it is possible to make the potential of the junction point B lower than the threshold voltage of the inverter IV1 rapidly within or after the delay time period t3 by setting drive capability of the N type MOS transistor Q3 to a relatively large value. When the potential at the junction point B becomes lower than the threshold voltage of the inverter IV1, the output of the bonding option judging circuit portion 22 becomes high level and the output signal BOPT of the output waveform shaping circuit 23 becomes low level.

As described, since, when the bonding option pad 24 is in the floating state, the potential at the junction point B is lowered by discharging it through the N type MOS transistors Q3 and Q4 in the bonding option judging circuit 20 during the delay time period t3 after initial application of the power source voltage to the semiconductor device 26 and thus there is a discharging path formed by only the N type MOS transistor Q4 after the delay time period t3, it is possible to reliably lower the potential at the junction point B even when the capability thereof is small, to thereby operate the bonding option judging circuit 20 normally. That is, with the potential at the junction point B lower than the threshold voltage of the inverter IV1, the output signal BOPT of the bonding option judging circuit 20 becomes low level.

The output signal BOPT is supplied to the function selecting circuit portion 29 of the internal circuit to make a certain predetermined function of the semiconductor device 26 operable selectively. When the semiconductor memory device 26 is, for example, a random access memory, the self refresh cycle is set to 2 ms by making the bonding option pad 24 in floating state, or, during normal operation thereof, the semiconductor device 26 is fixed to a condition of performing non-serial operation.

That is, in the second embodiment of the present invention, the N type MOS transistors Q3 and Q4 having different capability for discharging the bonding option pad 24 are used and the bonding option pad 24 is discharged by the N type MOS transistor Q3 having larger capability during the predetermined delay time period from the initial application of the power source to the semiconductor device. Therefore, when the bonding option pad 24 is connected to the power source, a large current flows during only the short time immediately after the power source is connected and thus it is possible to reduce power consumption. When the bonding option pad 24 is not bonded, the bonding option pad 24 is strongly driven in the short time after the power source on. Therefore, there is no erroneous operation occurs even when the driving capability is reduced thereafter, so that the bonding option judging circuit portion 20 can output a normal signal.

As described hereinbefore, according to the present invention, two transistors connected to a signal line from a bonding option pad are provided in a floating measure circuit of a bonding option judging circuit included in a semiconductor device. One of the transistors has a smaller capability than that of the other and is made conductive continuously. The other transistor having larger capability is used during a relatively short time after a power source is first applied to the semiconductor device. Therefore, it is possible to reduce power consumption during normal operation of the semiconductor device regardless of whether or not the bonding option pad is bonded. Further, an erroneous selection of function due to erroneous judgement performed in the bonding judging circuit can be prevented, resulting in reliable selection of function of the semiconductor device.

It is apparent that the present invention is not limited to the above embodiments but may be modified and changed without departing from the scope and spirit of the invention.

What is claimed is:

1. A semiconductor comprising a bonding pad and a judging circuit including means for detecting a potential of said bonding pad and outputting a signal representative of the potential of said bonding pad, said judging circuit further comprising first means for driving said bonding pad to a predetermined potential with a first driving capability, and second means for driving said bonding pad to said predetermined potential with a second driving capability during a predetermined time period from application of a power supply voltage to said semiconductor device, wherein said first means includes a first transistor connected between a first voltage terminal and said bonding pad and having a gate connected to a second voltage terminal, and said second means includes a second transistor connected between said first voltage terminal and said bonding pad and having a gate supplied with a signal for turning said second transistor on during said predetermined time period, and wherein said second transistor has a channel width larger than that of said first transistor.

2. The semiconductor device as claimed in claim 1, wherein said judging circuit further comprises a level detection circuit, coupled to said bonding pad, and an output waveform shaping circuit, responsive to an output of said level detection circuit, for outputting the signal representative of the potential of said bonding pad.

3. The semiconductor device as claimed in claim 1, wherein said judging circuit further comprises a bonding judging circuit, and an output waveform shaping circuit, responsive to an output of said bonding judging circuit, for outputting the signal representative of the potential of said bonding pad.

4. A semiconductor device comprising a bonding pad and a judging circuit including means for detecting a potential of said bonding pad and outputting a signal representative of the potential of said bonding pad, said judging circuit further comprising first means for driving said bonding pad to a predetermined potential with a first driving capability, and second means for driving said bonding pad to said predetermined potential with a second driving capability during a predetermined time period from application of a power supply voltage to said semiconductor device, wherein said first means includes a first transistor connected between a first voltage terminal and said bonding pad and having a gate connected to a second voltage terminal, and said second means includes a second transistor connected between said first voltage terminal and said bonding pad and having a gate supplied with a signal for turning said second transistor ON during said predetermined time period, and wherein said second transistor has a channel length shorter than that of said first transistor.

5. The semiconductor device as claimed in claim 4, wherein said judging circuit further comprises a level detection circuit, coupled to said bonding pad, and an output waveform shaping circuit, responsive to an output of said level detection circuit, for outputting the signal representative of the potential of said bonding pad.

6. The semiconductor device as claimed in claim 4, wherein said judging circuit further comprises a bonding judging circuit, and an output waveform shaping circuit, responsive to an output of said bonding judging circuit, for outputting the signal representative of the potential of said bonding pad.

7. A semiconductor device comprising a bonding pad and a judging circuit including means for detecting a potential of said bonding pad and outputting a signal representative of the potential of said bonding pad, said judging circuit further comprising first means for driving said bonding pad to a predetermined potential with a first driving capability, and second means for driving said bonding pad to said predetermined potential with a second driving capability during a predetermined time period from application of a power supply voltage to said semiconductor device, wherein said first means includes a first transistor connected between a first voltage terminal and said bonding pad and having a gate connected to a second voltage terminal, and said second means includes a second transistor connected between said first voltage terminal and said bonding pad and having a gate supplied with a signal for turning said second transistor ON during said predetermined time period, and wherein said second transistor has a threshold voltage value lower than that of said first transistor.

8. The semiconductor device as claimed in claim 7, wherein said judging circuit further comprises a level detection circuit, coupled to said bonding pad, and an output waveform shaping circuit, responsive to an output of said level detection circuit, for outputting the signal representative of the potential of said bonding pad.

9. The semiconductor device as claimed in claim 7, wherein said judging circuit further comprises a bonding judging circuit, and an output waveform shaping circuit, responsive to an output of said bonding judging circuit, for outputting the signal representative of the potential of said bonding pad.

* * * * *